United States Patent [19]

Jin et al.

[11] Patent Number: 5,187,149

[45] Date of Patent: Feb. 16, 1993

[54] METHOD OF MAKING A RIBBON-LIKE OR SHEET-LIKE SUPERCONDUCTING OXIDE COMPOSITE BODY

[75] Inventors: Sungho Jin, Millington; Thomas H. Tiefel, North Plainfield, both of N.J.

[73] Assignee: AT&T Bell Laboratories, Murray Hill, N.J.

[21] Appl. No.: 656,354

[22] Filed: Feb. 15, 1991

[51] Int. Cl.$^5$ ............................ B05D 5/12; B05D 3/02
[52] U.S. Cl. ........................................ 505/1; 505/733; 505/704; 427/62; 427/375; 427/376.2; 427/376.1
[58] Field of Search ............................ 505/1, 733, 704; 427/62, 63, 375, 376.2, 376.1

[56] References Cited

U.S. PATENT DOCUMENTS 4,880,771 11/1989 Cava et al. ............................ 505/1
4,952,554 8/1990 Jin et al. ............................ 505/1
5,070,071 12/1991 Geballe et al. ............................ 505/1

FOREIGN PATENT DOCUMENTS 63-291322 11/1988 Japan.
2-279507 11/1990 Japan.

OTHER PUBLICATIONS

Jin et al., "Fabrication of Dense $Ba_2YCu_3O_{7-\delta}$ Superconductor Wire by Molten Oxide Processing", Appl. Phys. Lett. 51(12) Sep. 1987, pp. 943–945.
"Partial Melt Growth Process of $Bi_2Sr_1Ca_1Cu_2O_x$ Textured Tapes on Silver", by J. Kase et al., *Japanese Journal of Applied Physics*, vol. 29, No. 7, Jul. 1990, pp. L1096–L1099.
"Textured Thick Films of $Bi_2Sr_2Ca_1Cu_2O_x$", by D. R. Dietderich et al., *Japanese Journal of Applied Physics*, vol. 29, No. 7, Jul. 1990, pp. L1100–L1103.
"Phase Alignment in Ag-Clad Bi-Sr-Ca-Cu-O (2:2:1:2) Wires", by R. D. Ray, II et al., *Applied Physics Letters*, 57(27), Dec. 31, 1990, pp. 2948–2950.
"Critical Currents Near $10^6$ A cm$^{-2}$ at 77K in Neutron-Irradiated Single-Crystal $YBa_2Cu_3O_7$", by R. B. van Dover et al., *Nature*, vol. 342, Nov. 2, 1989, pp. 55–57.
"High-Field Critical Current Densities in $Bi_2Sr_2Ca_1Cu_2O_{8+x}$/Ag Wires", by K. Heine et al., *Applied Physics Letters*, 55(23), Dec. 4, 1989, pp. 2441–2443.
"Critical Currents and Flux Pinning in Ag Stabilized High $T_c$ Superconductor Wires", by J. Tenbrink et al., *Cryogenics*, 1990 vol. 30 May, pp. 422–426.
"Optimism Abounds for Superconductivity in 1991", *Superconductor Week*, vol. 5, No. 1, Jan. 7, 1991.
"Properties of Bi(Pb)-Sr-Ca-Cu-O Superconducting Tapes Prepared by the Doctor-Blade Process", by E. Yanagisawa et al., *Applied Physics Letters*, 54 (25), Jun. 19, 1989, pp. 2602–2604.
"A New High-$T_c$ Oxide Superconductor Without A Rare Earth Element", by H. Maeda et al., *Japanese Journal of Applied Physics*, vol. 27, No. 2, Feb., 1988, pp. L209–L210.
"High Critical Currents in Y-Ba-Cu-O Superconductors", by S. Jin et al., *Applied Physics Letters*, 52(24), Jun. 13, 1988, pp. 2074–2076.
"Large Magnetic Hysteresis in a Melt-Textured Y-Ba-Cu-O Superconductor", by S. Jin et al., *Applied Physics Letters*, 54(6), Feb. 6, 1988, pp. 584–586.

Primary Examiner—Shrive Beck
Assistant Examiner—Roy V. King
Attorney, Agent, or Firm—E. E. Pacher

[57] ABSTRACT

A method of making a ribbon-like or sheet-like superconducting composite body is disclosed. The method is well suited for making long lengths (e.g., >100m) of ribboon or large areas (e.g., >100cm$^2$) of sheet-like composite. The method comprises forming a Bi-Sr-Ca-Cu-oxide-containing layer on a metal (exemplarily Ag) substrate, and mechanically deforming (typically by rolling) the thus formed composite such that the oxide is densified to more than 80% of the theoretical density. Subsequently the oxide layer is at least partially melted and allowed to re-solidify such that a large portion of the oxide crystals has c-axis alignment. After appropriate heat treatment in an $O_2$-containing atmosphere, thus produced superconductor ribbons or sheets can have high $J_c \geq 10^4$, frequently $>10^5$ A/cm$^2$) for temperatures less than about 20K and in magnetic fields less than about 5T.

11 Claims, 3 Drawing Sheets

METHOD OF MAKING A RIBBON-LIKE OR SHEET-LIKE SUPERCONDUCTING OXIDE COMPOSITE BODY

FIELD OF THE INVENTION

This invention pertains to the field of high temperature superconductors.

BACKGROUND OF THE INVENTION

The discovery of superconductivity in the La-Ba-Cu oxide system by Bednorz and Muller precipitated worldwide activity that very soon resulted in the discovery of other classes of oxide superconductors, frequently collectively referred-to as "high $T_c$" superconductors. Among the classes of high $T_c$ superconductors is the class of Bi-Sr-Ca-Cu oxide superconductors. See, for instance, H. Maeda et al., *Japanese Journal of Applied Physics*, Vol. 27 (1988), L209; and U.S. Pat. No. 4,880,771 (incorporated herein by reference).

One of the problems that so far have prevented significant commercial use of "bulk" high $T_c$ superconductors is the relatively low current-carrying ability of bulk samples of these materials. It will be appreciated that bulk samples consist of many superconductor grains or crystallites that are packed to form a relatively dense body. The current-carrying ability is generally expressed in terms of the critical current density $J_c$, which is a function of temperature and magnetic field.

There are at least two problems that contribute to the observed low values of $J_c$ in conventional bulk samples of high $T_c$ (by "high $T_c$" we mean generally $T_c \gtrsim 30K$, preferably $>77K$; by "$T_c$" we mean the highest temperature at which the D.C. resistance is zero to within experimental limits) oxide superconductors. One of the two problems is the so-called "weak link" problem. This pertains to the relatively low value of current that can flow without resistance from one superconductor grain to an adjoining one. This current frequently is referred to as the "inter-grain" current. The other is the so-called "flux flow" problem. This pertains to the relatively low current that can flow essentially without resistance within a given superconductor grain, due to weak flux pinning. Low values of critical current density are, however, not an inherent property of high $T_c$ oxide superconductors since current densities of the order of $10^6$ A/cm$^2$ have been observed in thin films of high $T_c$ superconductor material.

Significant progress towards solution of the weak link problem has already been made. See S. Jin et al., *Applied Physics Letters*, Vol. 52(24), pp. 2074–2076, 1988; S. Jin et al., *Applied Physics Letters*, Vol. 54(6), pp. 584–586, 1989; and U.S. patent application Ser. No. 126,083, all incorporated herein by reference. The progress resulted from the discovery of so-called "melt-textured growth"(MTG), a processing technique that comprises (complete or partial) melting and oriented re-solidification of the superconductor material, resulting in highly textured material that can sustain significantly higher current densities than conventionally prepared bulk high $T_c$ superconductor material. Progress has also been made towards overcoming the flux flow problem. See, for instance, R. B. van Dover et al., *Nature*, Vol. 342, pp. 55–57; and U.S. patent application Ser. No. 07/442,285, filed Nov. 28, 1989 for S. Jin et al.

It has been observed previously that Ag-clad wires of Bi-Sr-Ca-Cu oxide superconductors can have quite high $J_c$. For instance, K. Heine et al. (*Applied Physics Letters*, Vol. 55 (23), pp. 2441–2443) report making short lengths of Ag-clad Bi$_2$Sr$_2$CaCu$_2$O$_{8+x}$(2212) wires by the "powder in tube"(see U.S. Pat. No. 4,952,554) method, and observing $J_c$ of up to $5.5 \times 10^4$ A/cm$^2$ at 4.2K and zero magnetic field, and up to $1.5 \times 10^4$ A/cm$^2$ at 4.2K and 26T. See also J. Tenbrink et al., *Cryogenics*, Vol. 30, pp. 422–426.

J. Kase et al. (*Japanese Journal of Applied Physics*, Vol. 29(7), pp. L1096–L1099; incorporated hereby by reference) report making a B$_2$Sr$_2$CaCu$_2$-oxide/silver composite "tape" by a method that involves forming a Bi-Sr-Ca-Cu-oxide-containing green tape by means of a doctor-blade process, cutting a sample (e.g., 30 mm × 3 mm × 50 μm) from the green tape and laying the sample onto Ag foil. Subsequently the composite was subjected to a heat treatment that comprised a partial melting of the oxide material on the Ag foil. When cooling the composite slowly from the partially melted state (890° C.) to 870° C., followed by a quench from that temperature, strong c-axis alignment of the oxide material was observed. "C-axis alignment" refers to alignment of the crystallographic c-axis of an oxide crystallite essentially perpendicular to the substrate (in this case Ag-foil) surface. $J_c$ as high as $1.4 \times 10^5$ A/cm$^2$ at 4.2K and 25T were reported. The magnetic field is believed to have been parallel to the plane of the foil. See also D. R. Dietderich et al., *Japanese Journal of Applied Physics*, Vol. 29(7), pp. L1100–L1103, also incorporated herein by reference.

R. D. Ray et al. (*Applied Physics Letters*, Vol. 57(27), pp. 2948–2950; incorporated herein by reference) report forming Ag-clad Bi-Sr-Ca-Cu-oxide wires by the powder-in-tube method, followed by rolling the pulled-down powder-filled composite into ribbon shape, with thickness of 100 μm. After melt processing and grinding off one side of the Ag cladding, X-ray analysis of the thus exposed oxide core showed pronounced c-axis alignment of the oxide crystallites.

Although substantial progress regarding increased $J_c$ has already been made, further increase would be desirable. A significant shortcoming however is the current lack of techniques capable of producing long lengths of high $T_c$ superconductors. For instance, *Superconductor Week*, Vol. 5(1), Jan. 7, 1991, on page 1 reports as follows: ". . . (Dr. Allen) Hermann agreed with (Dr. Douglas) Finnemore that increasing the length of the conductors is still a problem to some extent. However, he noted that researchers are now making meters of silver-sheathed wire." It will be readily appreciated that it will be necessary to make kilometer, not meter, lengths of conductors. A further shortcoming is the current lack of manufacturing techniques that could be adapted for continuous processing of long (e.g., >100 m) lengths of high $T_c$ superconductors.

For instance, using the powder-in-tube technique to produce long lengths of wire requires large-cross-section reduction of the starting "billet". Exemplarily, to obtain a 1 km length of wire from a 1 m long starting tube, a 1000:1 reduction in cross section is required. This will frequently be difficult to accomplish with a composite body such as a powder-filled metal tube. On the other hand, although the doctor-blade technique as used by Kase et al. (op. cit) could in principle be used to form long ribbons, the Kase et al. technique typically does not make efficient use of the superconductor material because it is frequently difficult to form thin (e.g., <10 μm) layers by the doctor blade method, and because the interface-induced texture of the oxide material typically is confined to a few micron thickness adjacent to the Ag/oxide interface. Texture (more particularly, c-axis alignment) is required in order to achieve the desired high $J_c$.

Furthermore, currently practiced techniques for making thin (e.g., <1 μm thick) superconductor layers typically involve such relatively expensive and complex techniques as sputtering, evaporation, or laser ablation. It is typically difficult to produce relatively large areas (e.g., >100 cm$^2$) of high quality thin superconductor film by prior art techniques.

In view of the importance of the ability to produce long lengths of high $J_c$ superconductors, a method that can efficiently produce high $T_c$ superconductor ribbon of essentially unlimited length and high $J_c$, and that can be readily embodied in a continuous process, would be of great significance. This application discloses such a method. It also discloses a method that can readily produce relatively large areas of thin superconductor sheet.

DEFINITIONS AND GLOSSARY OF TERMS

"$J_c$" is the maximum current density that can be carried by a superconductor at a given temperature and in a given magnetic field.

By a "ribbon" we mean herein a body whose thickness t is much less (typically by at least a factor of 10) than its width w, and w in turn is much less (by at least a factor of 10) than its length l. By a "sheet-like" body we mean a body having t much less than both of the other two dimensions, with the other two dimensions typically being of the same order of magnitude.

The "theoretical density" of a given material herein is the density of a single crystal of the material or, equivalently, of a pore-free polycrystalline sample of the material.

SUMMARY OF THE INVENTION

In a broad aspect the invention is embodied in a method of making an article that comprises a composite body (comprising a superconducting oxide layer on a metal substrate) that can be employed to make long lengths (e.g., >100 m, even >1 km) or relatively large sheets (e.g., >100cm$^2$, even >0.1m$^2$) of the composite body, and that is readily adaptable to continuous processing. The method can be used to efficiently (i.e., using a relatively small amount of superconductor material) produce composite superconductor bodies having a high current-carrying capacity, as expressed by relatively large $J_c$. In a further broad aspect the invention is embodied in an article that comprises a continuous long length (>100 m) or a large continuous sheet (>100 cm$^2$) of a composite superconductor body of relatively large current-carrying capacity (exemplarily $J_c \geq 10^4$, preferably >$10^5$ A/cm$^2$ at temperatures $\leq 20K$ and in magnetic fields $\leq 5T$).

A preferred embodiment of the inventive method comprises providing a metal substrate (the metal selected such that the substrate does substantially not oxidize during a subsequent heat treatment; exemplarily the metal is Ag, or a base metal coated with Ag), and forming on a major surface of the substrate a layer that comprises Bi-Sr-Ca-Cu-containing oxide particles. The density of the oxide material in the layer is relatively low, typically less than 80% of the theoretical density of the oxide material. The layer typically comprises, in addition to the oxide particles (typical size 1-5 μm), organic binder material, and can be formed by any appropriate thick film deposition technique, including the doctor blade technique. The currently preferred technique is spray deposition.

The inventive method comprises mechanically deforming (typically by rolling at a temperature below about 800° C.) the substrate with the layer thereon such that the density of the oxide material in the layer is increased to more than 80% of the theoretical density, and such that the thickness of the layer after the subsequent melt step is less than 10 μm. The mechanical deformation process also results in substantial (e.g., 50% or more) length increase of a ribbon-like composite or in a substantial (e.g., 50% or greater) areal increase of a sheet-like composite. The embodiment still further comprises at least partially melting the superconductive oxide material on the substrate, substantially without melting the substrate, and allowing the molten oxide material to re-solidify, such that at least 50% (preferably at least 75%) of the material of the resulting oxide layer is in the form of c-axis oriented (i.e., having their crystallographic c-axis substantially normal to the substrate plane) crystallites.

The inventive method typically also comprises removing unwanted organics from the layer prior to the melting step. Typically this is accomplished by a conventional heating step in an $O_2$-containing atmosphere. The organics-removal can be carried out before the mechanical deformation step, at an intermediate stage of the deformation step, or subsequent to the deformation step. In all cases, however, the removal will be carried out prior to the melting of the oxide layer on the substrate.

The inventive method can be employed to produce a thin (e.g., <1 μm, preferably <0.5 μm) superconducting film on an appropriate metal substrate. This typically involves a relatively large amount of mechanical deformation. The inventive method thus can serve as a low cost, high speed fabrication technique for large area thin film superconductor material. Exemplarily such material can advantageously be used as a magnetic shield.

A preferred embodiment of the inventive article comprises a superconductive body that comprises a superconducting oxide layer on a major surface of a metal substrate. At least the portion of the substrate that is in contact with the oxide layer comprises Ag, and the superconductive oxide comprises Bi, Sr, Ca, and Cu. The density of the oxide layer is more than 80% of the theoretical density of the oxide, and the thickness of the layer is less than 10 μm. At least 50% of the material of the superconducting oxide layer is in the form of crystallites oriented such that their crystallographic c-axis is essentially perpendicular to the substrate. Significantly, the superconducting body has ribbon-shape and a continuous length of at least 100 m, or the body has sheet-shape and a size of at least 100 cm$^2$. Associated with the superconducting layer is a critical current density $J_c \geq 10^4$ (preferably >$10^5$) A/cm$^2$ at temperatures less than 20K and in magnetic fields less than 5T.

DETAILED DESCRIPTION OF SOME PREFERRED EMBODIMENTS

An exemplary embodiment of the inventive method comprises the following steps. A mixture of conventional $Bi_{1.6}Pb_{0.3}Sb_{0.1}Sr_2Ca_2Cu_3O_x$ powder, about 10% by volume of conventional binder (CLADAN No. 73140; other known binder materials could also be used), and acetone was sprayed by means of an air brush on both surfaces of a 25 μm thick silver foil. The mixture was dried in air, resulting in a 30–75 μm thick layer on each side of the Ag foil. This composite was sintered (800° C., 4 hours, in $O_2$), resulting in removal of the binder. After cooling to room temperature the composite was cold rolled (8 passes) such that an about 90% reduction in cross sectional area resulted. The rolled composite had ribbon shape, had about 15 μm overall thickness, with each superconductor layer about 3 μm thick.

Whereas the density of each layer after drying and binder removal but prior to cold rolling was substantially less than 80% of the theoretical density of the Bi-Pb-Sb-Sr-Ca-Cu oxide, the density after cold rolling was greater than 80% of the theoretical density. This densification is an important aspect of the invention, and omission of densification by mechanical deformation generally results in inferior superconducting properties of the resulting body. The observed inferior properties are possibly associated with a lesser degree of c-axis orientation of the re-solidified oxide layer, as compared to layers produced according to the invention. Furthermore, in currently preferred embodiments of the invention the thickness of the (or each) superconductor layer is less than 10 μm, since layers that are thicker than about 10 μm typically have relatively poor c-axis texture in the region away from the superconductor/substrate interface.

The cold rolled ribbon was subjected to a heat treatment that involved partial melt processing. The heat treatment was carried out in an $O_2$-containing atmosphere ($P_{O2}/P_{N2} \sim 0.08$; "P" denotes partial pressure) and consisted of heating to 820° C., holding at that temperature for 12 hours, relatively fast (about 250° C./h) heating to about 880° C., essentially immediately followed by continuous cooling (about 60° C./h) to 830° C. After 40 h at that temperature the ribbon was furnace cooled to a temperature below 200° C.

The thickness of the superconductor layers on the thus produced composite ribbon showed some reduction in thickness (from ~3 to ~2 μm), as compared to the as-rolled condition. This reduction is likely associated with further densification of the superconductor material and, possibly, some loss of volatile components such as Bi or Pb. The ribbon exhibited $T_c$ (R=O) of about 80K, in agreement with X-ray diffraction results which indicate that the superconductor layers predominantly contain the so-called 2212 phase of the Bi-Sr-Ca-Cu-containing superconducting oxide system.

Figure 1:
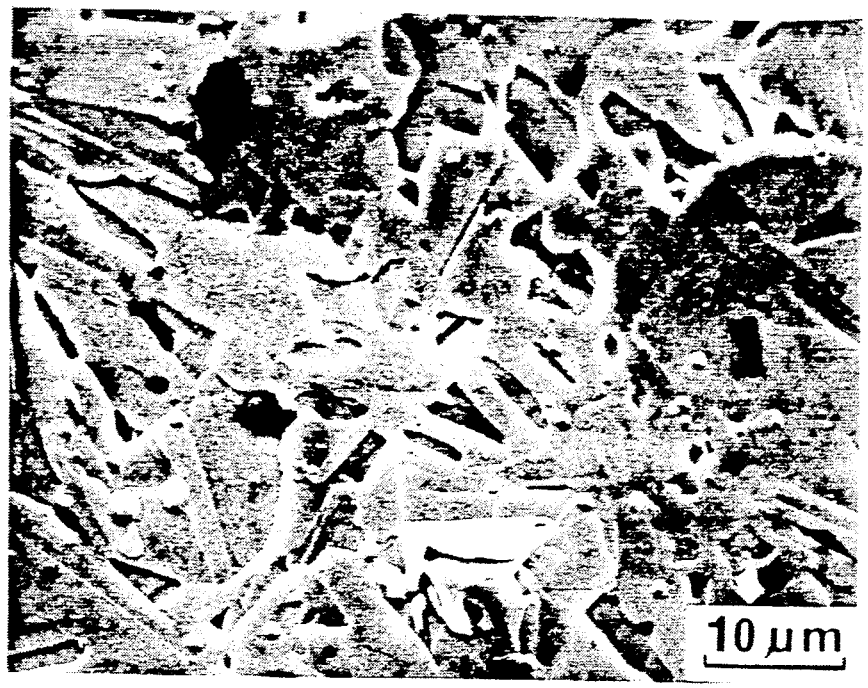
FIGS. 1 and 2 are micrographs of the surface of a superconductor layer formed according to the invention.
Figure 2:
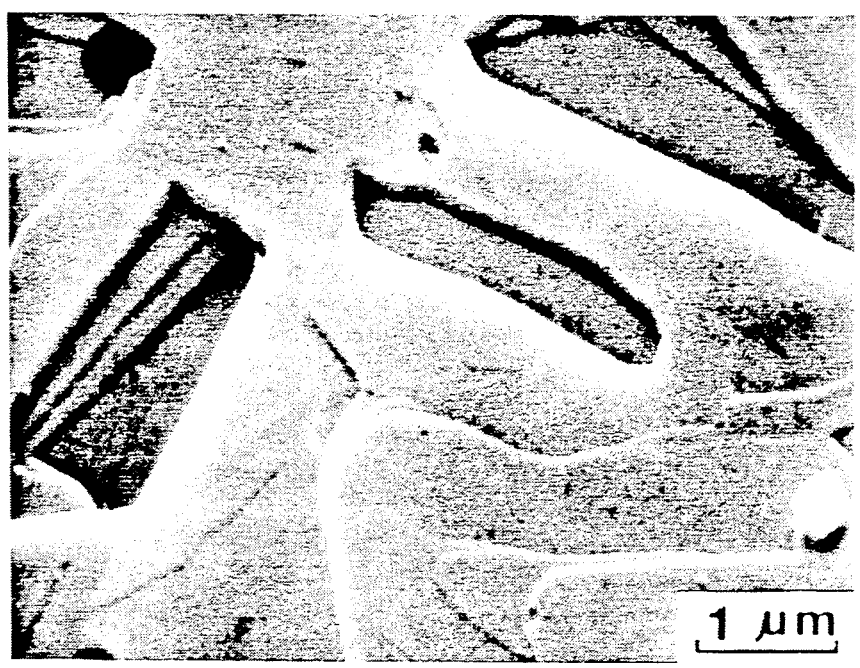
Figure 3:
FIG. 3 is a cross-sectional micrograph of a composite ribbon formed according to the invention.

FIGS. 1 and 2 are exemplary scanning electron microscope (SEM) micrographs of the top surface of the thus produced composite ribbon. FIG. 1 clearly reveals the dense structure of the superconductor layer, and FIG. 2 shows the basal-plane, layered growth of the crystallites. FIG. 3 is an exemplary SEM micrograph of a cross-sectional fracture surface of the composite ribbon which further illustrates the c-axis texture of the superconductor layer on the Ag substrate.

Figure 4:
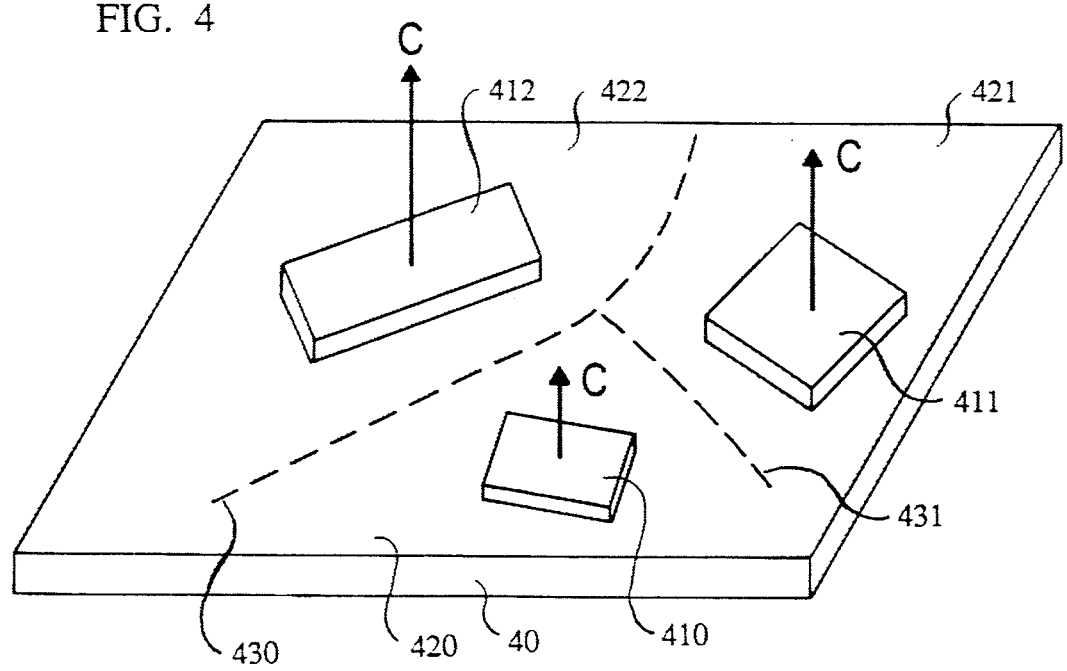
FIG. 4 schematically depicts the orientation of crystallites in an exemplary composite body according to the invention.

Further X-ray analysis of the above described composite ribbon showed that more than 75% of the superconductor material had c-axis alignment, and that the average grain size was about 10 μm. The (001)-oriented grains however showed substantially random orientation of their a-b axes, resulting in large-angle boundaries between grains. This in-plane misorientation is schematically illustrated in FIG. 4, wherein numeral 40 refers to the substrate, and numerals 410–412 to exemplary crystallites which are understood to occupy regions 420–422, respectively, and form large angle grain boundaries along lines 430 and 431. Despite the existence of large angle boundaries between (001)-oriented crystallites the exemplary composite ribbon exhibited large $J_c$, as will be discussed in detail below.

Even though large $J_c$ can be attained in composite structures according to the invention that contain high angle boundaries between adjacent (001)-oriented crystallites, still better results are possibly obtainable if the nucleation of crystallites is controlled, exemplarily by means of melt processing involving movement of a temperature gradient through the composite structure. Techniques for accomplishing this are known. See, for instance, S. Jin et al., *Applied Physics Letters*, Vol. 52, p. 2074 (1988). Exemplarily, this can be accomplished by moving the composite through a hot zone.

Figure 5:
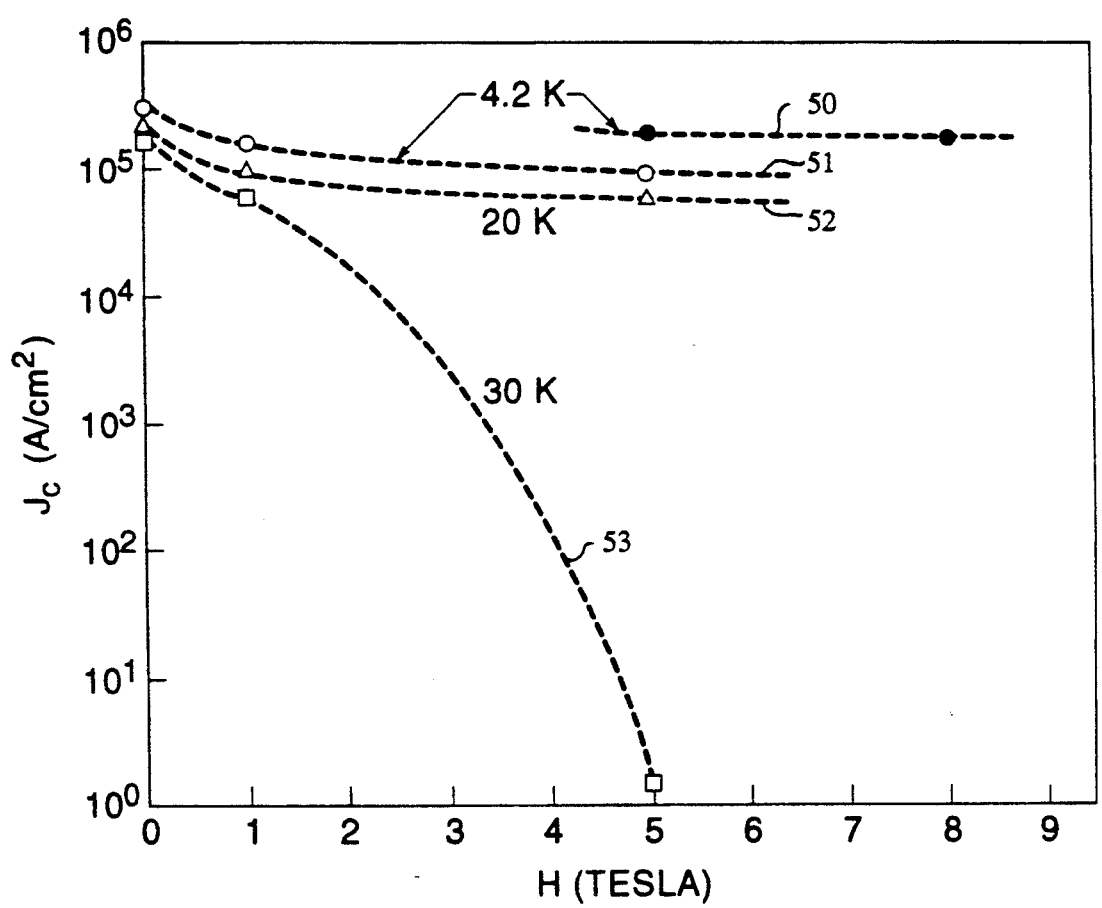
FIG. 5 presents exemplary data on $J_c$ vs. H in samples produced according to the invention.

A sample was cut from the above described composite ribbon, and the "transport" $J_c$ measured by a conventional technique. Some of the results are shown in FIG. 5, curve 50, together with results for a similarly produced one-sided sample (curves 51, 52, and 53). The magnetic field was applied normal to the substrate. This geometry is known to constitute the most rigorous test because it causes the most pronounced flux line movement. $J_c$ values in excess of $10^5$ A/cm$^2$ were observed, as can be seen from FIG. 5. Exemplarily, the double-sided sample exhibited $J_c \sim 2.3 \times 10^5$ A/cm$^2$ at 4.2 K., with H=8 T perpendicular to the substrate plane. The high values of $J_c$ typically are maintained up to about 20 K. However, raising the temperature to about 30 K. results in severe degradation of $J_c$ (see curve 53), attributable to the onset of thermally activated flux creep in the superconductor.

The above-recited exemplary procedure can be varied in a variety of ways, as will be apparent to those skilled in the art. For instance, it may be desirable in many cases to carry out at least a part of the mechanical deformation treatment before removal of the organics from the layer, since during the initial stages of the deformation treatment (e.g., during the initial few passes through rolling equipment) adhesion of the layer to the substrate frequently is better if the layer contains a binder.

The mechanical deformation treatment need not be cold rolling but can be, exemplarily, warm rolling or even hot rolling, provided that the temperature is selected such that degradation of the oxide powder is avoided. Typically this will be the case if the temperature during mechanical deformation is below about 800° C. If desired, mechanical deformation and heat treatment can be alternated repeatedly.

The initial stages of the mechanical deformation step typically result primarily in densification of the oxide powder, and later stages typically result primarily in deformation and elongation (increase in area) of the substrate/oxide composite. For the purpose of densification as well as for desired thickness reduction (for high $J_c$), mechanical deformation (typically rolling) with thickness reduction of at least 50% (preferably >75% or even 90%) is desirable. Alternatively, length (area) increases of at least 20%, preferably 50 or 100%, are desirable.

The value of $J_c$ inter alia typically depends on the amount of mechanical deformation, film thickness, and heat treatment conditions, including the details of the melting step. In general it is considered desirable that the time during which the oxide is in the liquid state is relatively short, exemplarily <30 minutes, in order to minimize excessive decomposition and/or evaporation loss of volatile constituents. Treatment steps prior to melting and subsequent to re-solidification can be conventional, and frequently will depend on the stoichiometry of the oxide.

EXAMPLE 1

A continuous superconductor ribbon of length in excess of 100 m is produced by spray-coating a Bi-Sr-Ca-Cu-oxide-containing layer onto a continuously fed Ag ribbon (40 μm thick, 5 mm wide). The oxide and the organic constituents of the layer material are substantially as described above. The coated Ag ribbon is wound on a take-up spool, the composite is repeatedly (4 passes) cold rolled such that the overall thickness of the composite is reduced to 20 μm, and the rolled ribbon is wound on a ceramic take-up spool. The organic constituents of the layer are removed by raising the temperature of the take-up spool with the composite ribbon thereon to 700° C. in 4 hours in $O_2$. Subsequently the composite ribbon is again cold rolled (4 passes), wound on a take-up spool, and continuously fed from the take-up spool through a multi-zone tubular furnace in an $O_2$-containing atmosphere. The feed rate and the temperature profile of the furnace are selected such that the oxide material is about 30 seconds in the liquid state. The Ag ribbon with the re-solidified oxide thereon is wound on a ceramic take-up spool and maintained at 830° C. for 60 hours, followed by a slow cool to room temperature. The resulting superconductive ribbon has $J_c > 10^5$ A/cm$^2$ for $H \leq 5$ T and temperatures of at most 20 K. The oxide layer has more than 50% c-axis orientation.

EXAMPLE 2

A superconductive solenoid is produced by making a "two-sided" superconductive ribbon substantially as described in Example 1, except that the Ag ribbon with the re-solidified oxide layer thereon is wound on a ceramic tubular body, with Ag sheet as insulation between winding layers. After completion of the heat treatment current leads are attached to the end of the superconducting ribbon.

EXAMPLE 3

Superconductor layers of thickness 300 nm on both sides of 6 μm Ag foil were produced by a process substantially as described above, except that cold rolling and melt processing each were repeated twice. The particle size of the $Bi_{1.6}Pb_{0.3}Sb_{0.1}Sr_2Ca_2Cu_3O_x$ powder was about 1 μm. The resulting superconductor layer had $J_c$ in excess of $10^4$ A/cm$^2$ for fields $\leq 5$ T and temperatures $\leq 20$ K.

We claim:

1. A method of making an article comprising a Bi-Sr-Ca-Cu-containing superconducting oxide layer on a major surface of a substrate, associated with the superconducting oxide being a critical temperature $T_c > 30$ K, a critical current density $J_c$ and a crystal structure that comprises an ab-plane and a c-axis normal to the ab-plane, the method comprising
   a) providing the substrate;
   b) forming on the major surface of the substrate a layer that comprises a Bi-Sr-Ca-Cu-containing oxide; and
   c) heat treating the substrate with the layer thereon in an $O_2$-containing atmosphere such that the Bi-Sr-Ca-Cu-containing superconducting oxide layer results;
   characterized in that
   d) the substrate is a metal substrate selected such that the substrate does substantially not oxidize during step c);
   e) the layer formed on the major surface comprises Bi-Sr-Ca-Cu-containing oxide particles, with the density of oxide material in the layer being less than 80% of the theoretical density of the oxide;
   f) the method further comprises mechanically deforming the substrate with the layer thereon such that the density of Bi-Sr-Ca-Cu-containing oxide material in the layer is increased to more than 80% of the theoretical density of said Bi-Sr-Ca-Cu-containing oxide, and such that the thickness of the layer is less than 10 μm; and still further comprises at least partially melting the densified layer, substantially without melting the metal substrate, and allowing the molten material to re-solidify, such that at least 50% of the material of the oxide layer is in the form of crystallites oriented such that the c-axis of the crystallites is essentially perpendicular to the major surface of the substrate.

2. Method of claim 1, wherein the metal substrate comprises silver.

3. Method of claim 2, wherein the metal substrate comprises silver-coated base metal.

4. Method of claim 2, wherein mechanically deforming the substrate with the layer thereon comprises rolling at a temperature or temperatures of at most 800° C.

5. Method of claim 2, wherein the layer formed on the major surface further comprises a binder material, and wherein the method further comprises maintaining, prior to the melting step, the substrate with the layer thereon at a temperature and for a time effective to result in removal of essentially all binder material from the layer.

6. Method of claim 5, wherein the binder removal is carried out before completion of said mechanically deforming the substrate with the layer thereon.

7. Method of claim 6, wherein said mechanical deforming of the substrate with the layer thereon comprises a multiplicity of rolling passes, with binder removal carried out after one or more of said rolling passes.

8. Method of claim 4, wherein said substrate is ribbon-like or sheet-like, and wherein the rolling is carried out such that the length of the ribbon-like substrate is increased by at least 50%, or such that the area of the sheet-like substrate is increased by at least 50%.

9. Method of claim 2, carried out such that $J_c \geq 10^4$ A/cm$^2$ for temperatures $\geq 20$ K and for magnetic fields $\geq 5$ T.

10. Method of claim 9, wherein the substrate is a continuous ribbon that comprises silver and has a length of at least 100 m.

11. Method of claim 2, wherein the substrate is a ribbon-like or sheet-like substrate having two opposed major surfaces, and wherein the method comprises forming on each of said two major surfaces of the substrate a layer that comprises the Bi-Sr-Ca-Cu-containing oxide.

* * * * *